United States Patent [19]
Ono

[11] Patent Number: 5,273,244
[45] Date of Patent: Dec. 28, 1993

[54] PLATE-LIKE MEMBER CONVEYING APPARATUS

[75] Inventor: Yuji Ono, Sagamihara, Japan

[73] Assignee: Tokyo Electron Sagami Limited, Kanagawa, Japan

[21] Appl. No.: 785,506

[22] Filed: Oct. 30, 1991

[30] Foreign Application Priority Data

Oct. 31, 1990 [JP] Japan .................................. 2-294745
Oct. 31, 1990 [JP] Japan .................................. 2-294746

[51] Int. Cl.$^5$ ............................................. H01L 21/00
[52] U.S. Cl. .................................. 248/176; 248/295.1; 211/1.57
[58] Field of Search .................... 248/295.1, 244, 176; 211/1.57, 187

[56] References Cited
U.S. PATENT DOCUMENTS

3,940,174 2/1976 Mayer ............................ 211/1.57 X

FOREIGN PATENT DOCUMENTS

6435746 3/1989 Japan .

Primary Examiner—Alvin C. Chin-Shue
Attorney, Agent, or Firm—Oblon, Spivak, McClelland, Maier & Neustadt

[57] ABSTRACT

A plate-like members conveying apparatus includes a rotating shaft and five support arms for supporting semiconductor wafers. The arms are vertically stacked at equal intervals and parallel to each other. The middle arm is fixed between two intermediate arms. Above and below the intermediate arms, two outer arms are located. The intermediate arms are coupled to an intermediate arm pinion coaxially fixed to the rotating shaft. The outer arms are coupled to an outer arm pinion coaxially fixed to the rotating shaft and having twice diameter of the intermediate arm pinion. These two pinions are rotated together upon the rotation of the rotating shaft. By the rotation of the intermediate arm pinion, the intermediate arms are moved to opposite direction each other. By the rotation of the outer arm pinion, the outer arms are moved to opposite direction each other by a distance twice a distance between the intermediate arms. Thus, the interval between the adjacent two arms is changed while keeping the five arms at equal intervals.

13 Claims, 16 Drawing Sheets

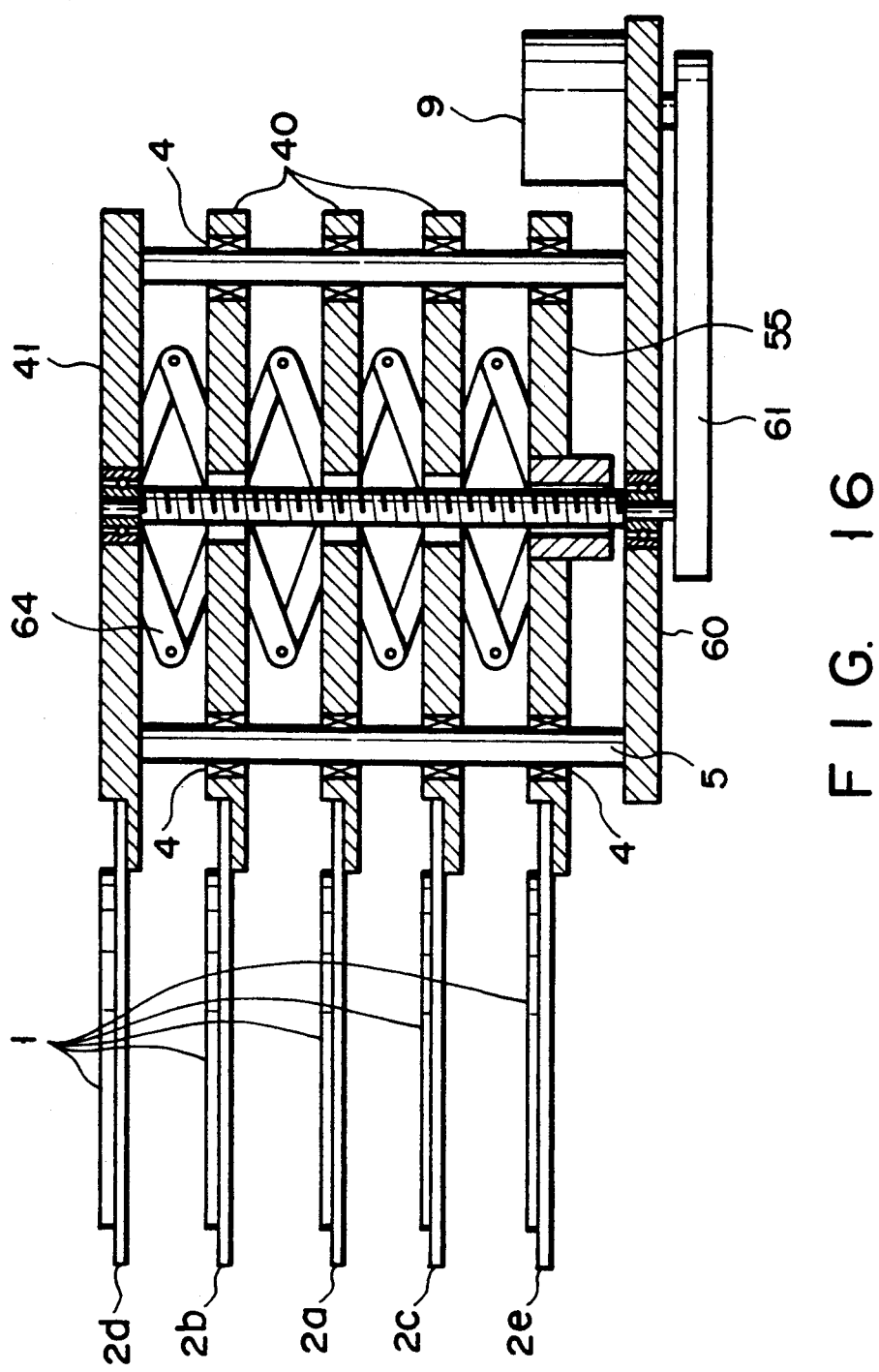

PLATE-LIKE MEMBER CONVEYING APPARATUS

BACKGROUND OF THE INVENTION

1. Field of the Invention

The present invention relates to a plate-like member conveying apparatus.

2. Description of the Related Art

In semiconductor manufacturing steps and the like, various types of plate-like member conveying apparatuses have been used as apparatus for conveying plate-like members such as semiconductor wafers.

For example, Published Unexamined Japanese Patent Application No. 64-35746 discloses a plate-like member conveying apparatus in which five arms for supporting semiconductor wafers are arranged such that semiconductor wafers are vertically arranged at equal intervals to be substantially parallel to each other. In this apparatus, a plurality of ball screws having different leads and directions are formed on a rotatable shaft, and nuts are arranged on the proximal end portions of the arms to oppose these ball screws. The proximal end portions of the arms are respectively attached to the ball screws. When the shaft is rotated, the arms are translated to change the pitch of the semiconductor wafers.

In such a plate-like member conveying apparatus, a transfer operation can be performed while the pitch of a plurality of semiconductor wafers is changed. For example, the apparatus is used to transfer semiconductor wafers between a wafer cassette and a wafer boat for a heat-treatment apparatus. The transfer operation is automatically performed in accordance with the control of the program previously set in the computer.

In the above-described conventional plate-like conveying apparatus, however, since metal ball screws and metal nuts which are engaged with each other are used, if the shaft is rotated a large number of times to change the interval between plate-like members, the ball screws and the nuts are brought into slidable contact with each other to generate a large amount of dust, e.g., metal dust and a mist of a lubricanting oil. Such dust is scattered, and some of the scattered dust adheres to the surfaces of semiconductor wafers, resulting in an increase in rejection rate of semiconductor devices. Especially in recent years, with an increase in integration density of a semiconductor device, there has been a great need to suppress the generation of only a little dust. Therefore, the generation of dust poses a serious problem.

SUMMARY OF THE INVENTION

The present invention has been made in consideration of the above situation, and has as its object to provide a plate-like member conveying apparatus which can reduce the amount of generated dust, e.g., metal dust and oil mist, as compared with a conventional apparatus.

According to the present invention, there is provided a plate-like member conveying apparatus for conveying a plurality of plate-like members while supporting the members to be vertically stacked at equal intervals and be substantially parallel to each other, comprising:

a first support arm for supporting a plate-like member;

second and third support arms, respectively arranged above and below the first support arm, for respectively supporting plate-like members;

a rotatable driving shaft;

a first rotating member coaxially fixed to the driving shaft to be rotated upon rotation of the driving shaft and having an outer surface;

a first coupling element for coupling the outer surface of the first rotating member to the second and third support arms, and for causing the second and third arms to vertically come close to each other and separate from each other in accordance with rotation of the first rotating member;

fourth and fifth support arms, respectively arranged above and below the second and third support arms, for supporting plate-like members, the fourth and fifth support arms being vertically separated from each other by a distance twice a distance between the second and third support arms;

a second rotating member coaxially fixed to the driving shaft to be rotated upon rotation of the driving shaft and having an outer surface; and a second coupling element for coupling the outer surface of the second rotating member to the fourth and fifth support arms, and for causing the fourth and fifth support arms to vertically come close to each other and separate from each other in accordance with rotation of the second rotating member, wherein the outer surfaces of the first and second rotating members are set to be different from each other so as to change intervals between the first to fifth support arms, while keeping the first to fifth support arms at equal intervals, and causing the fourth and fifth support arms to separate from each other by a distance twice a distance between the second and third support arms.

According to the present invention, therefore, the amount of generated metal dust or oil mist can be reduced in comparison with a case wherein arms are driven by using, e.g., ball screws.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 16 is a partially cutaway side view schematically showing a modification of the apparatus of the fourth embodiment.

DETAILED DESCRIPTION OF THE PREFERRED EMBODIMENTS

A plate-like member conveying apparatus according to the first embodiment of the present invention will be described below with reference to the accompanying drawings.

The plate-like member conveying apparatus of this embodiment is designed to transfer, e.g., semiconductor wafers 1 between a wafer carrier and a heat-treatment wafer boat of a vertical type heat-treatment apparatus.

Figure 1:
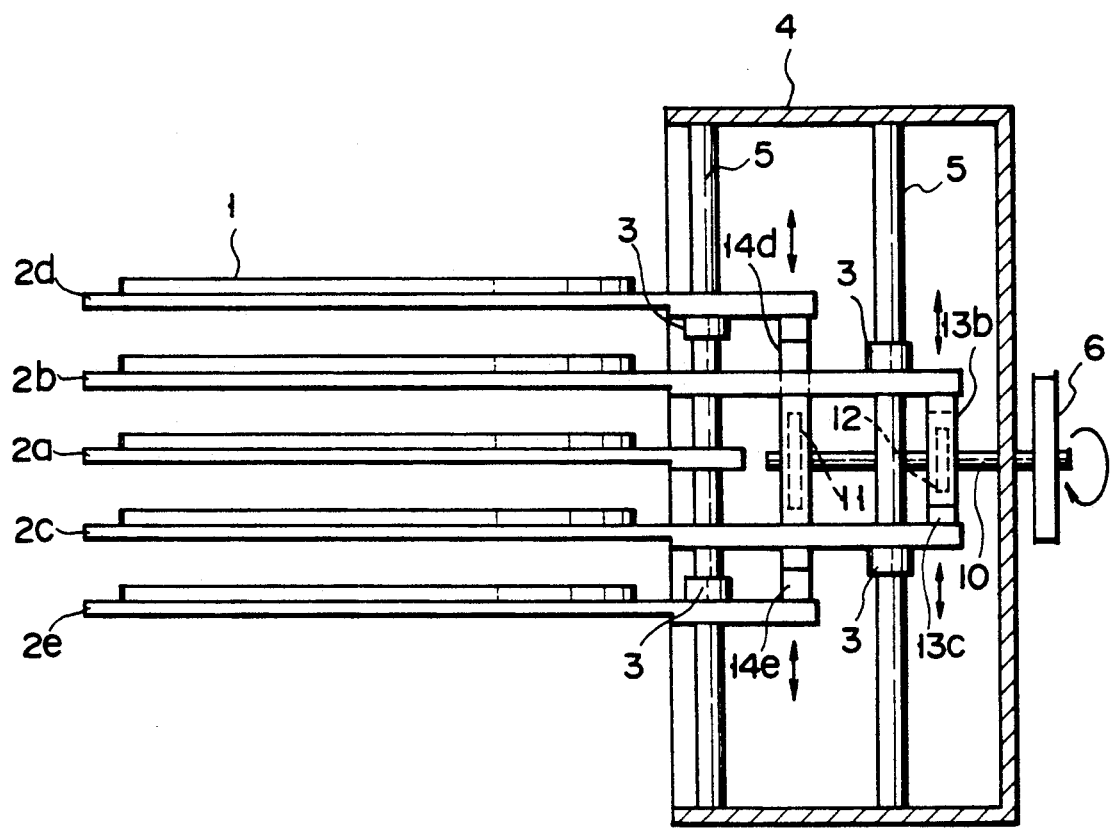
FIG. 1 is a side view schematically showing the internal mechanism of a plate-like member conveying apparatus according to the first embodiment of the present invention.
Figure 2:
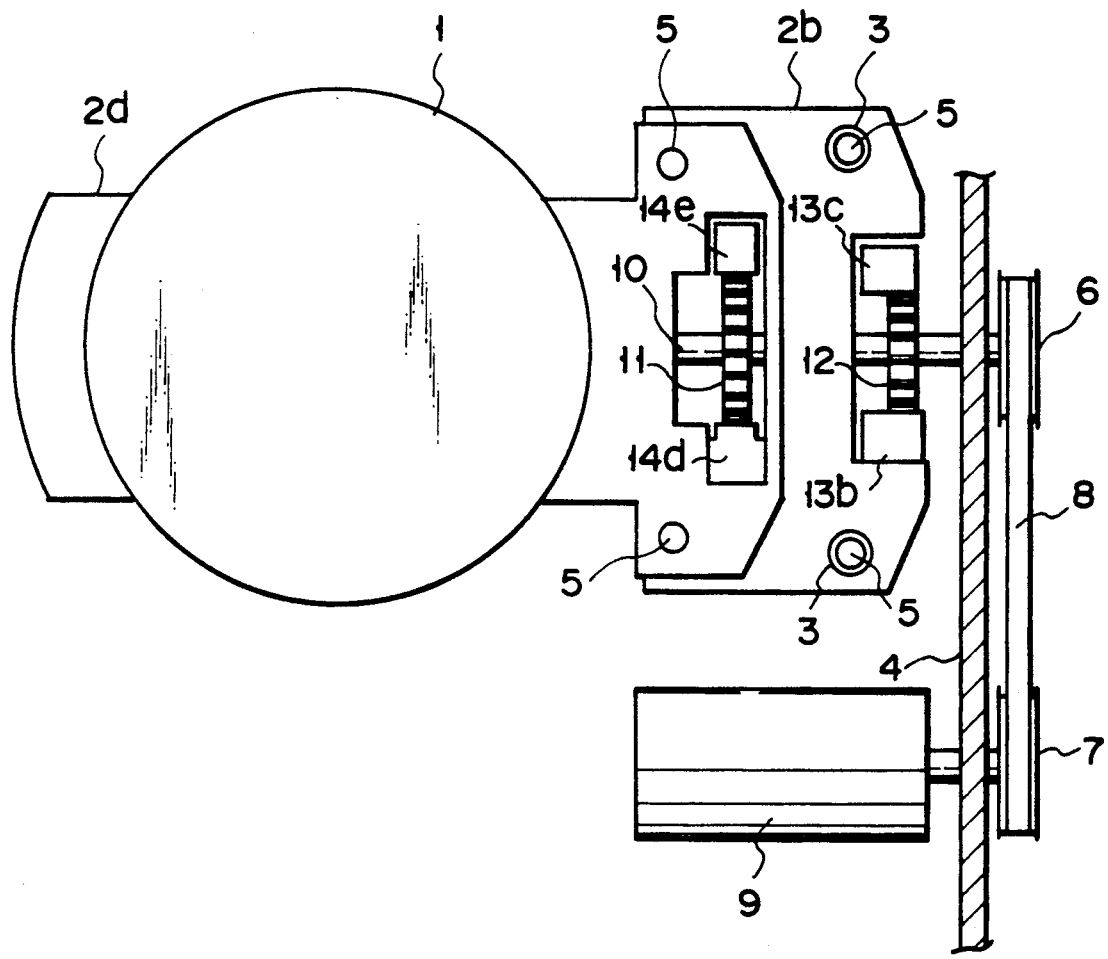
FIG. 2 is a top view of the apparatus in FIG. 1.

As shown in FIGS. 1 and 2, the plate-like member conveying apparatus includes five arms 2a to 2e which are formed to have thin plate-like shapes so as to support the semiconductor wafers 1 as plate-like members thereon. These arms 2a to 2e are vertically stacked at equal intervals to be substantially parallel to each other. With this arrangement, the semiconductor wafers 1 are coaxially supported by the arms 2a to 2e at equal intervals to be substantially parallel to each other.

Figure 3:
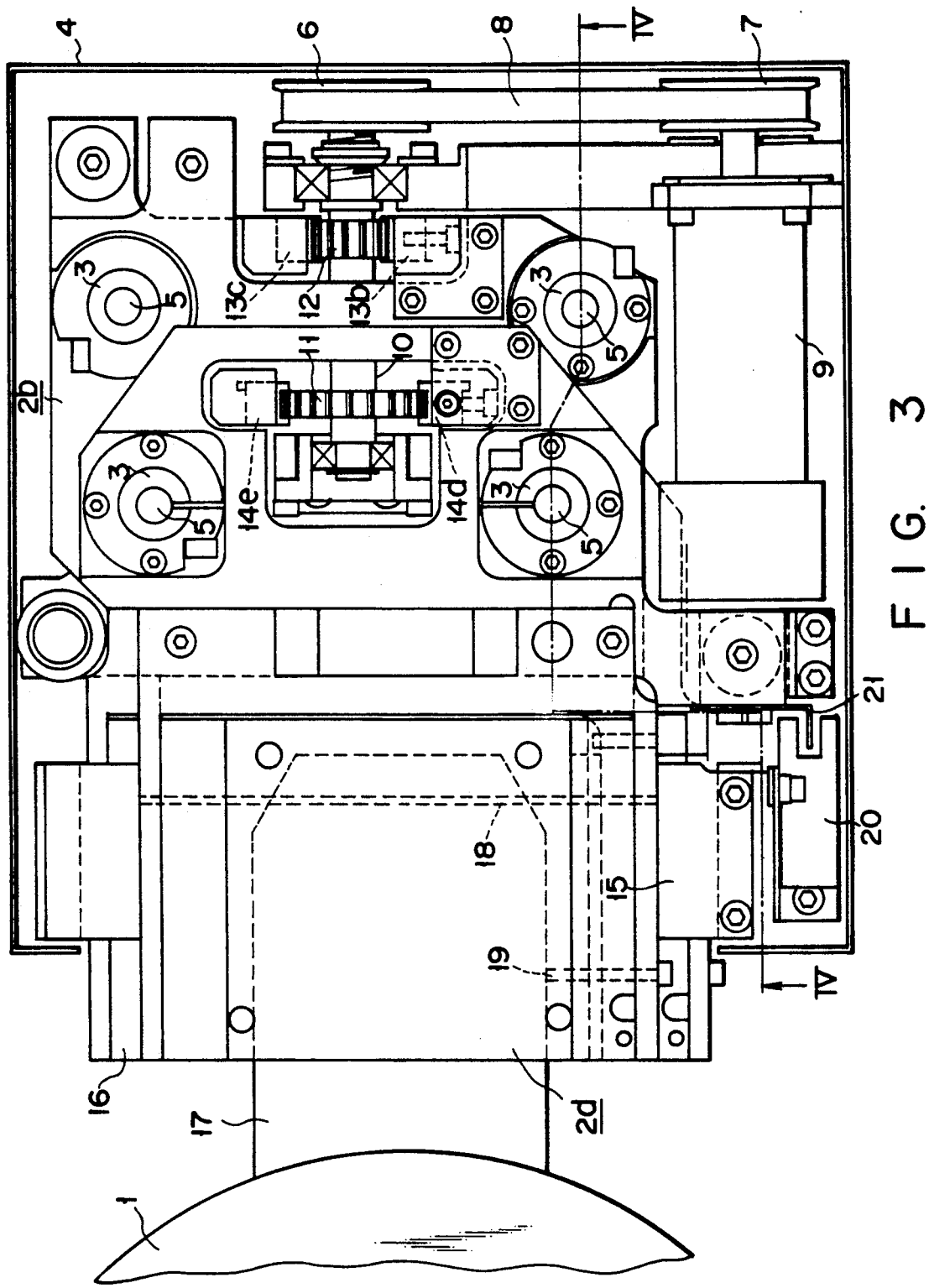
FIG. 3 is a top view showing the internal mechanism of the apparatus in FIG. 1 in detail.
Figure 4:
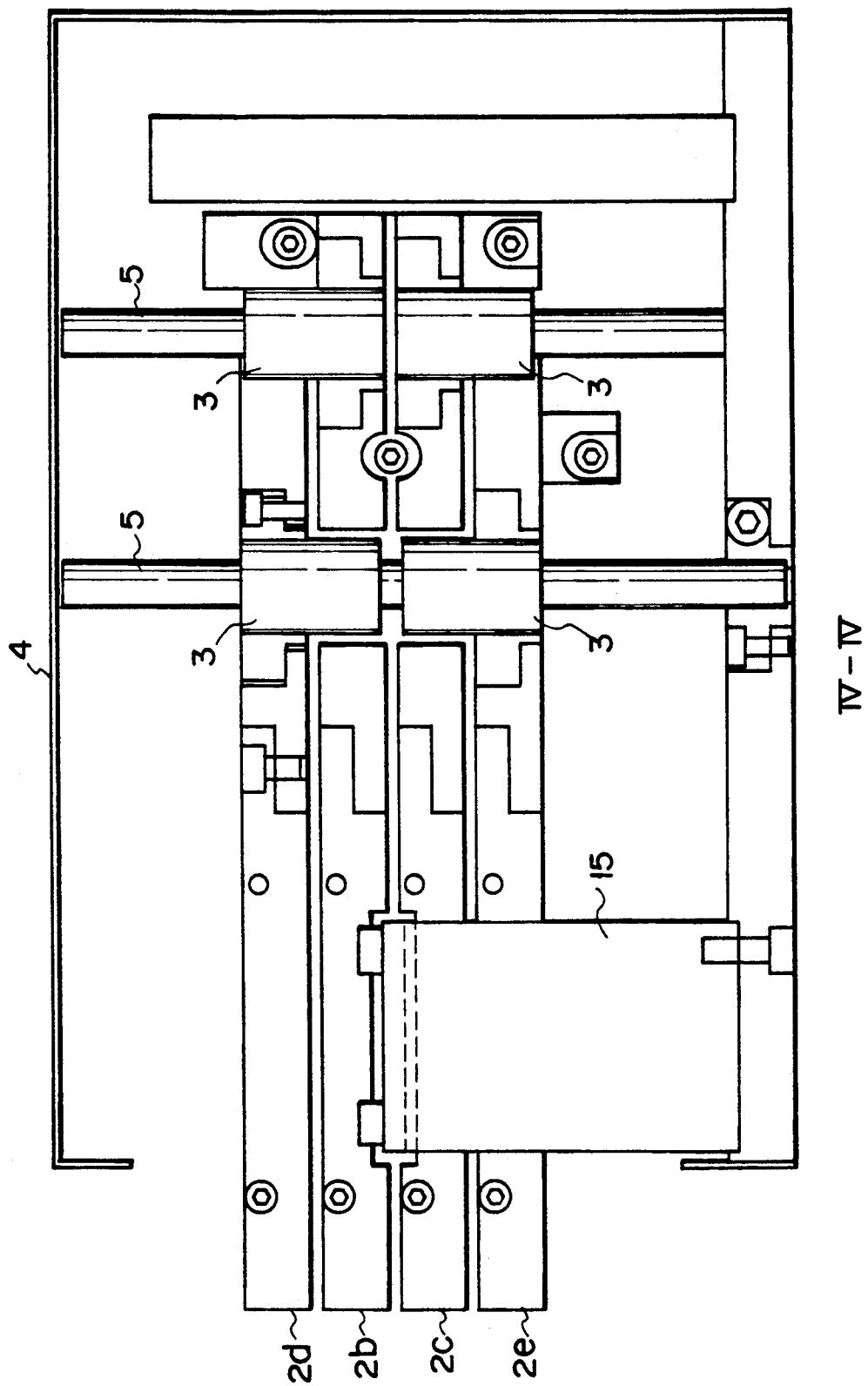
FIG. 4 is a side view of the apparatus in FIG. 3 viewed from a line IV—IV.

Of the arms 2a to 2e, the arm arranged in the middle, i.e., the middle arm 2a as the first support arm, is fixed to a stationary table 15 shown in FIGS. 3 and 4. As shown in FIG. 1, this middle arm 2a is fixed to be located in the middle of a frame 4 or at the middle point between the intermediate arms 2b and 2c. The arms located above and below the middle arm 2a, i.e., the intermediate arms 2b and 2c as the second and third arms, and the arms located above and below the intermediate arms 2b and 2c, i.e., the outer arms 2d and 2e as the fourth and fifth support arms, are moved in the vertical direction indicated by arrows in FIG. 1 to be caused to come close to each other or to separate from each other, thus changing the pitch of the semiconductor wafers 1.

The pitch of the semiconductor wafers 1 is changed by causing the intermediate arms 2b and 2c and the outer arms 2d and 2e to come close to each other or separate from each other while the semiconductor wafers 1 are kept at equal intervals. In order to perform such an operation, the distance between the outer arms 2d and 2e is always set to be twice a distance D between the intermediate arms 2b and 2c.

Two pairs of linear sliders 3, each incorporating a plurality of ball bearings, are respectively arranged at the proximal end portions of the intermediate arms 2b and 2c and the outer arms 2d and 2e so as to realize smooth movement of the arms 2b to 2e. Four round rods 5 are fixed to the frame 4 for supporting the arms 2a to 2e. The rods 5 vertically extend from the frame 4. The outer arms 2d and 2e are supported by the two round rods 5, of the four round rods 5, which are located the semiconductor wafer 1 side (on the left side in FIG. 1), to be vertically movable, whereas the intermediate arms 2b and 2c are supported by the remaining two round rods 5 (on the right side in FIG. 1) to be vertically movable.

As shown in FIGS. 2 and 3, a rotating shaft 10 as a rotatable driving shaft is arranged in substantially the middle of the frame 4 to be connected to a motor 9 through pulleys 6 and 7, and a belt 8 consisting of an elastic material such as silicone rubber. An outer arm pinion 11 and an intermediate arm pinion 12, each consisting of, e.g., DELRIN (trademark, marketed by E. I. DU PONT DE NEMOURS & COMPANY), a hard resin, are fixed to the rotating shaft 10 to be rotated upon rotation of the rotating shaft 10. The outer arm pinion 11 constitutes a second rotating member (second pinion), and the intermediate arm pinion 12 constitutes a first rotating member (first pinion). The diameter of the outer arm pinion 11 is set to be larger than that of the intermediate arm pinion 12. In addition, the number of teeth of the pinion 11 is set to be twice that of the pinion 12.

Racks 13b and 13c as the first coupling elements (first racks) are respectively provided for the intermediate arms 2b and 2c to couple the arms 2b and 2c to the intermediate pinion 12. These racks 13b and 13c are arranged to oppose each other through the intermediate arm pinion 12 and are designed to move the intermediate arms 2b and 2c in opposite directions by the same distance upon rotation of the intermediate arm pinion 12.

Similarly, racks 14d and 14e as the second coupling elements (second racks) are respectively provided for the outer arms 2d and 2e to couple the arms 2d and 2e to the outer arm pinion 11. These racks 14d and 14e serve to move the outer arms 2d and 2e in opposite directions by the same distance upon rotation of the outer arm pinion 11. Note that since the number of teeth of the outer arm pinion 11 is set to be twice that of the intermediate arm pinion 12, the distance between the outer arms 2d and 2e is always twice the distance between the intermediate arms 2b and 2c. In addition, the intermediate arms 2b and 2c and the outer arms 2d and 2e have shapes allowing the racks 13b, 13c, 14d, and 14e to respectively cross the arms 2b to 2c as if they penetrate through the arms.

As shown in FIG. 3, each of the arms 2a to 2e is divided into stationary and movable portions 16 and 17 respectively having elongated through holes. A common pin 18 is inserted into the through holes in the stationary and movable portions 16 and 17. The movable portion 17 is designed to pivot about the pin 18 with respect to the stationary portion 16. This pivoting operation is manually performed by an operator to finely adjust the distance between the corresponding arms. After this fine adjustment, the movable portion 17 is fixed with a machine screw 19 arranged on the stationary portion 16. For the sake of illustrative convenience, the stationary portions 16, the movable portions 17, the pins 18, and the machine screws 19 are not shown in FIGS. 1 and 2.

Figure 5:
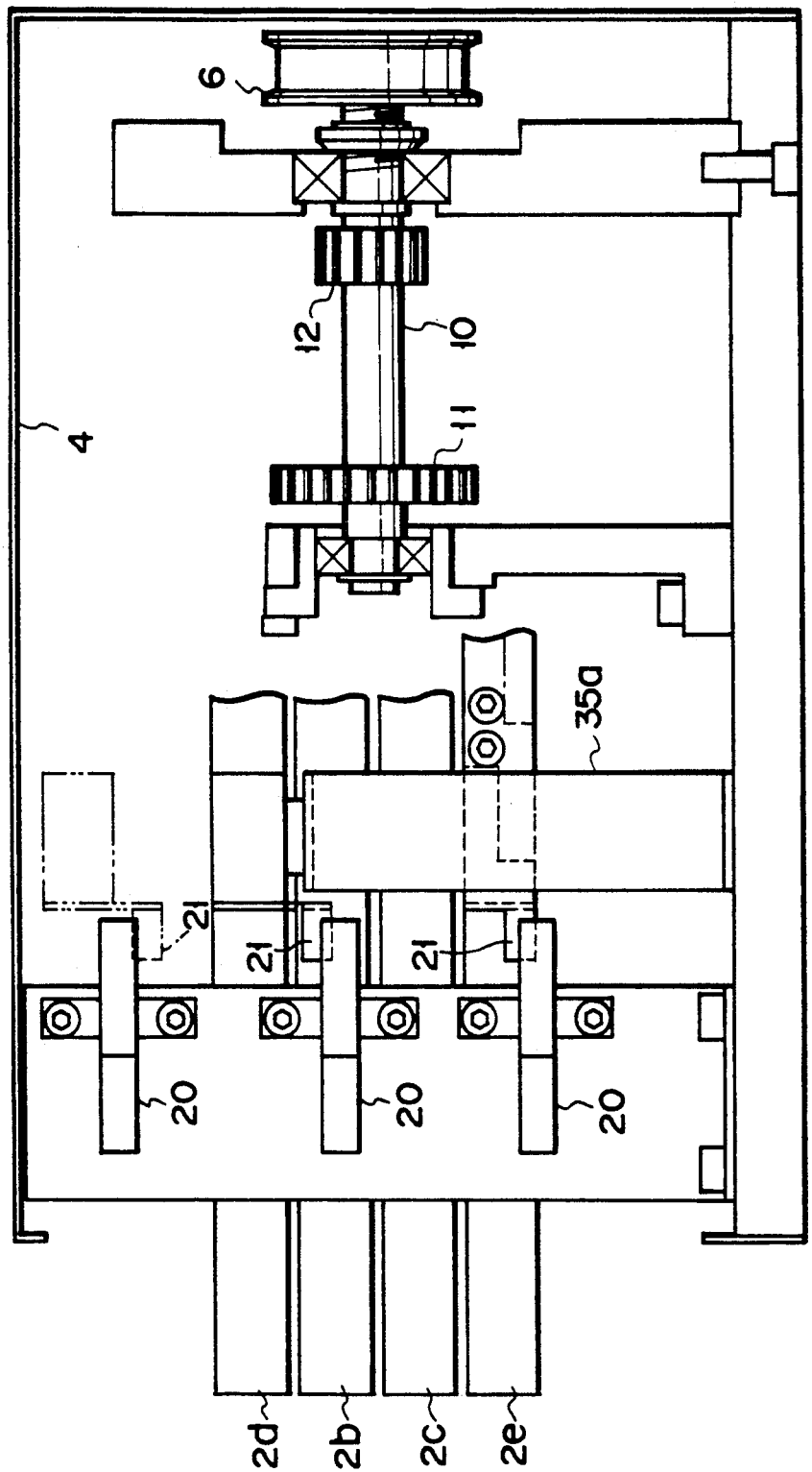
FIG. 5 is a side view showing a detailed arrangement of the apparatus in FIG. 3.

As shown in FIGS. 3 and 5, three optical sensors 20, each consisting of light-emitting and light-receiving elements, are arranged on one side of the arms 2a to 2e.

These optical sensors 20 are electrically connected to the motor 9 through a control circuit (not shown). A light-shielding plate 21 is arranged on one side of each of the outer arms 2d and 2e so as to shield light from the light-emitting element of a corresponding one of the optical sensors 20. When the outer arms 2d and 2e are moved to predetermined positions and the light-shielding plates 21 enter the optical sensors 20, optical changes in the optical sensors 20 are supplied, as changes in electrical signal, to the control circuit. The control circuit then controls the rotation of the motor 9. As a result, the intermediate arms 2b and 2c and the outer arms 2d and 2e can be reliably stopped at predetermined positions.

Figure 6:
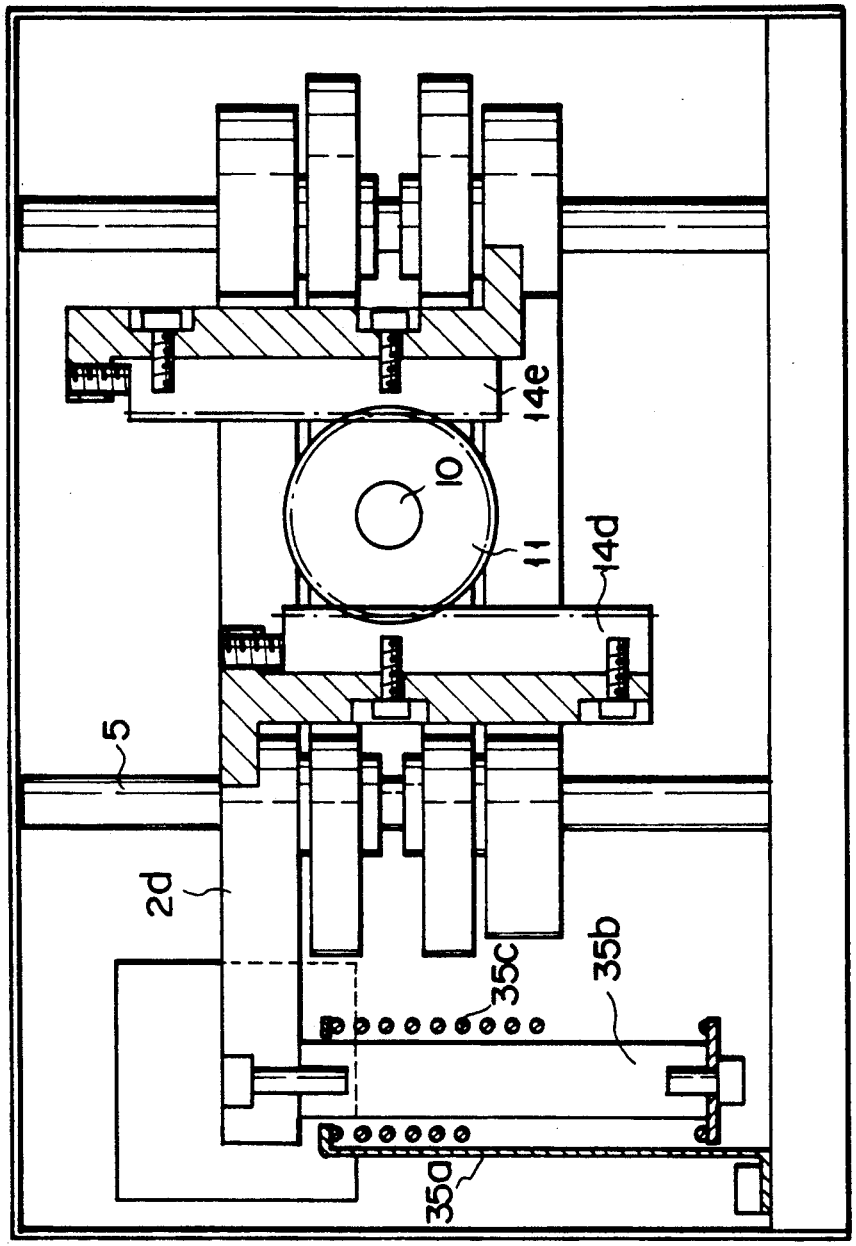
FIG. 6 is a rear view showing a detailed arrangement of the apparatus in FIG. 3.

As shown in FIG. 6, a backlash removing apparatus 35 is arranged on one side of the outer arm 2d to bias the outer arm 2d upward so as to remove a backlash between the racks 14d and 14e and the outer arm pinion 11. This backlash removing apparatus 35 includes a stationary plate 35a fixed to the frame 4, and a rod 35b attached to a lower portion of the outer arm 2d to vertically extend therefrom. A pressing spring 35c is arranged between the upper end portion of the stationary plate 35a and the lower end portion of the rod 35b to bias the outer arm 2d upward.

According to such a mechanism, the pitch of the semiconductor wafers 1 can be arbitrarily changed by slightly rotating the motor 9.

Figure 7:
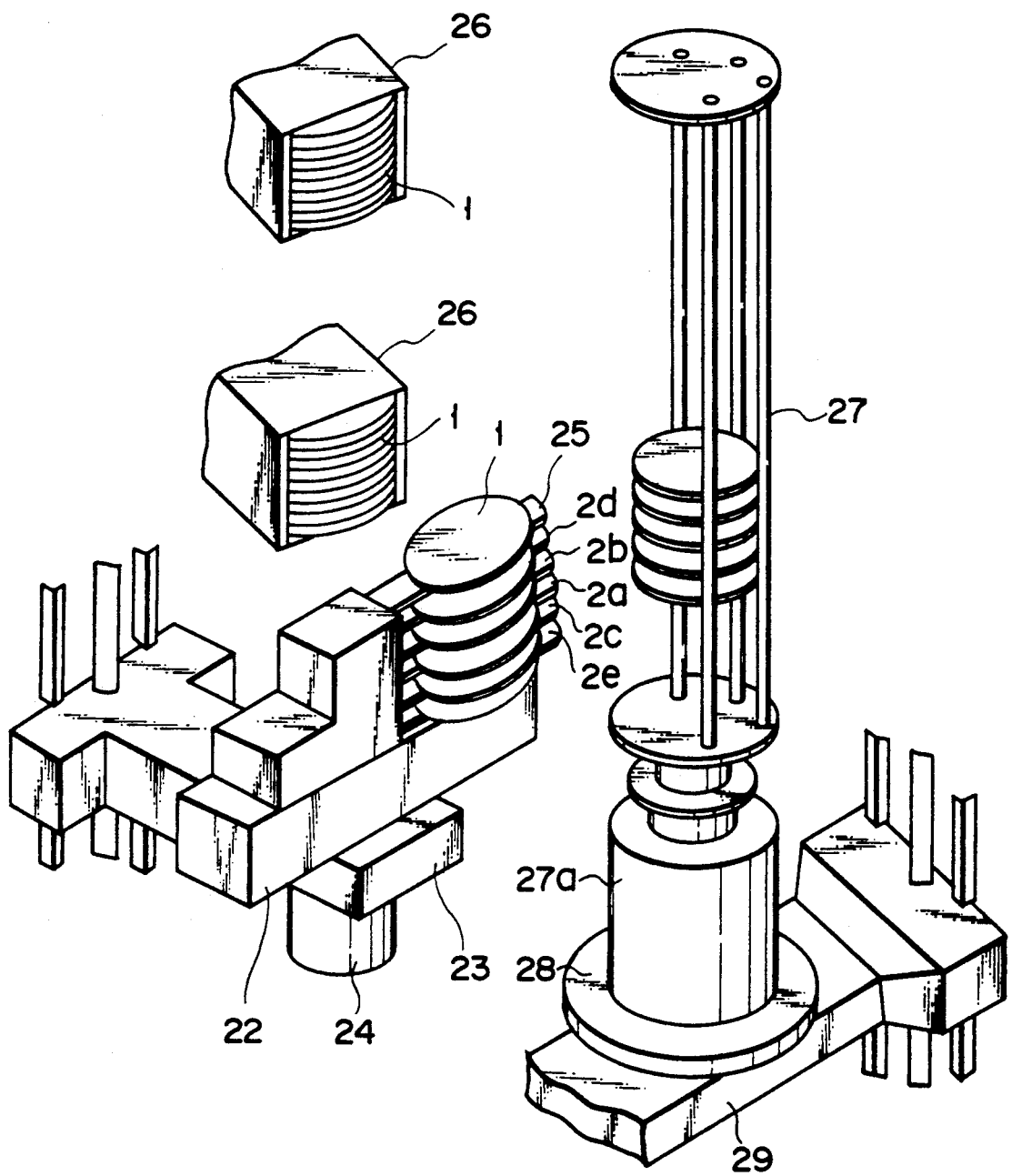
FIG. 7 is a perspective view for explaining an operation of the apparatus of the first embodiment.

As shown in FIG. 7, the mechanism having the above-described arrangement is arranged on a horizontally driving mechanism 22 for linearly moving the mechanism forward and backward, an elevating mechanism 23 for vertically moving the mechanism, and a horizontally rotating mechanism 24 for horizontally rotating the mechanism. A single wafer transfer arm 25 for transferring a single wafer is arranged above the arms 2a to 2e of the above-described mechanism so as to be moved independently of the arms 2a to 2e, thereby constituting the plate-like conveying apparatus of this embodiment.

As described above, this plate-like conveying apparatus is designed to transfer the semiconductor wafers 1 between a wafer carrier 26 and a heat-treatment wafer boat 27 (to be simply referred to as a wafer boat hereinafter) of a vertical type heat-treatment apparatus. The wafer pitch of this wafer carrier 26 is 3/16 inches, and 25 semiconductor wafers 1 are stored at this pitch in the wafer carrier 26. The wafer pitch of the wafer boat 27 is 9/16 inch, and 150 semiconductor wafers 1 are stored at this pitch in the wafer boat 27. And the apparatus changes the intervals of the semiconductor wafers 1 so as to transfer the wafers 1 between the wafer carrier 26 and the wafer boat 27.

The wafer boat 27 is composed of a heat-resistant material such as quartz and is placed in a furnace (to be described later). The wafer boat is mounted on a holding base 27a. This holding base 27a is arranged on a wafer boat elevating mechanism 29 through a thin disk-like lid member 28. The wafer boat 27 can be vertically moved by this wafer boat elevating mechanism 29.

A furnace (not shown) is arranged above the wafer boat 27. In this furnace, temperature setting can be properly performed within the range of, e.g., 500° to 1,200° C. The furnace has a soaking region at a predetermined position. In addition, an opening is formed in a lower portion of the furnace. The wafer boat 27 is loaded in the furnace from this opening by the boat elevating mechanism 29, and the opening is completely sealed with the lid member 28. As a result, the semiconductor wafers 1 stored in the boat 27 are placed in the soaking region of the furnace, and the furnace is tightly sealed.

An operation of the plate-like member conveying apparatus according to this embodiment will be described below.

The motor 9 is driven to rotate the rotating shaft 10, thus setting the intervals between the arms 2a to 2e to coincide with the wafer pitch (3/16 inches) of the wafer carrier 26. In this state, the frame 4 is moved to a position close to the wafer carrier 26 by using the horizontally driving mechanism 22, the elevating mechanism 23, and the horizontally rotating mechanism 24, and the arms 2a to 2e are inserted in the wafer carrier 26 to be respectively located below the lower surfaces of the semiconductor wafers 1.

Subsequently, the arms 2a to 2e are slightly raised at a predetermined distance by the elevating mechanism 23 so that the semiconductor wafers 1 in the wafer carrier 26 are mounted on the arms 2a to 2e one by one (a total of five wafers). Thereafter, the arms 2a to 2e are removed from the wafer carrier 26 and are moved to a position in front of the wafer boat 27.

The motor 9 is rotated at a predetermined amount to change the wafer pitch of the arms 2a to 2e to the wafer pitch (9/16 inches) of the wafer boat 27. The arms 2a to 2e are then inserted in the wafer boat 27 at predetermined positions. Thereafter, the arms 2a to 2e are lowered by the elevating mechanism 23. Thus, a predetermined number of semiconductor wafers 1, e.g. the five wafers 1 are transferred at once. By repeating the same operation, all of the semiconductor wafers 1 in the wafer carrier 26 are transferred to the wafer boat 27.

In a heat-treatment process, dummy wafers are sometimes arranged at upper and lower portions of the wafer boat 27, or a monitor wafer may be arranged between a predetermined number of semiconductor wafers 1. In such a case, semiconductor wafers are transferred one by one by using the single wafer transfer arm 25. After the heat treatment is completed, the treated semiconductor wafers 1 are transferred from the wafer boat 27 to the wafer carrier 26 in a reverse procedure to that described above.

As described above, according to this embodiment, the pitch of the semiconductor wafers 1 is changed by the racks 14d and 14e, the outer arm pinion 11, the racks 13b and 13c, and the intermediate arm pinion 12. Therefore, in comparison with, e.g., a case wherein ball screws are used, the number of revolutions of the motor 9 required to change the wafer pitch can be reduced, and the amount of generated dust can be decreased. In addition, the size of the apparatus can be reduced.

In the above embodiment, the middle arm 2a is fixed, while the intermediate arms 2b and 2c and the outer arms 2d and 2e are moved to change the pitch of the semiconductor wafers 1. However, for example, one of the outer arms 2d or 2e may be fixed, while the remaining arms are moved.

If the pitch of a plurality of plate-like members is changed by using pinions and racks, each consisting of a hard resin, as in the above-described manner, the generation of metal dust and oil mist can be suppressed. Furthermore, since the pinions and the racks are composed of a hard resin, the generation of dust can be further suppressed. Note that the material for the racks and the pinions is not limited to a hard resin, but a metal material such as stainless steel may be used.

A plate-like member conveying apparatus according to the second embodiment of the present invention will be described below with reference to FIGS. 8 and 9. Note that the same reference numerals in the second embodiment denote the same parts as in the first embodiment, and only different portion will be described below.

In the apparatus of this embodiment, pulleys and belts are used in place of the pinions 11 and 12, and the racks 13b, 13c, 14d, and 14e.

Figure 8:
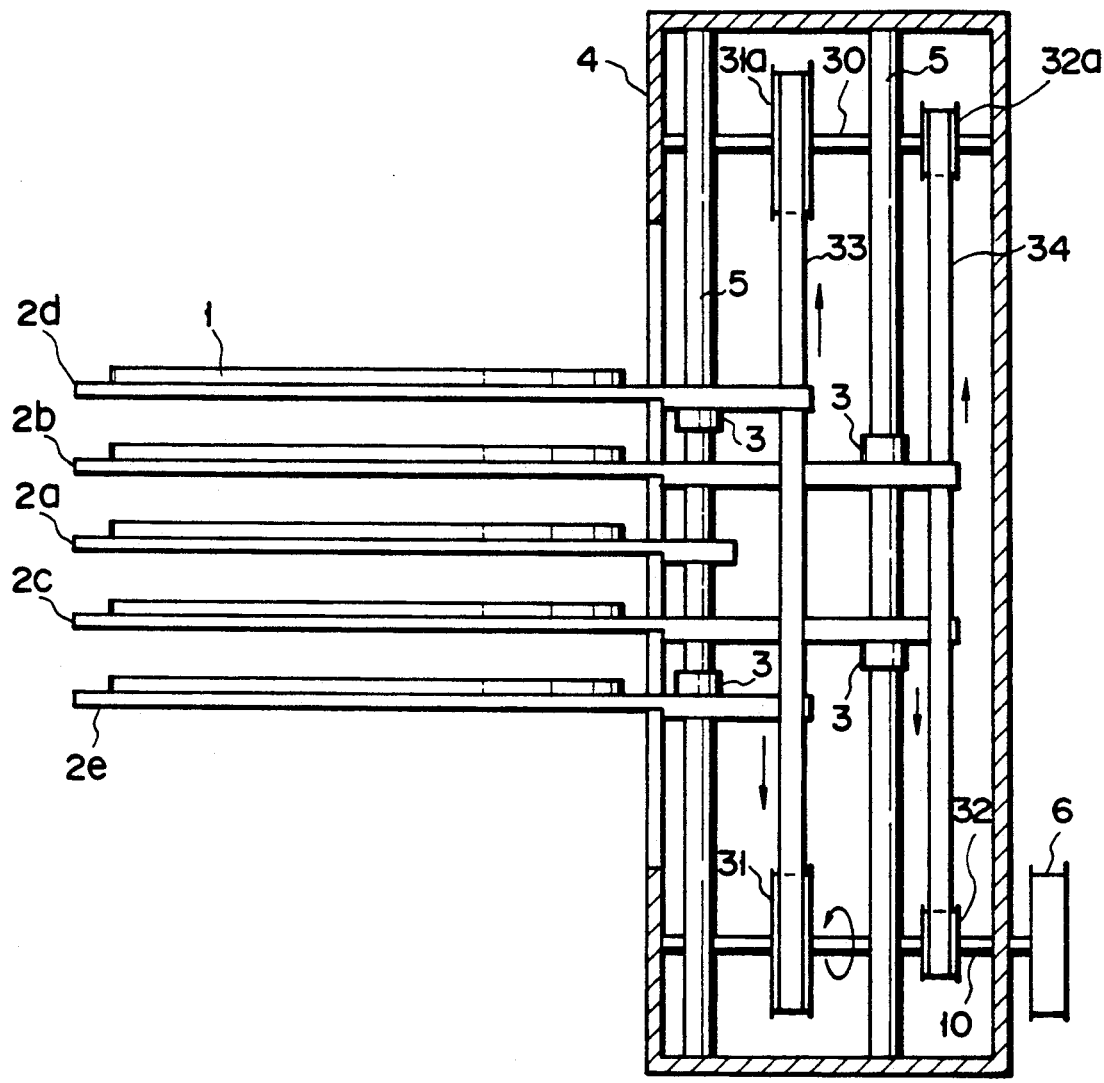
FIG. 8 is a side view schematically showing the internal mechanism of an apparatus according to the second embodiment of the present invention.
Figure 9:
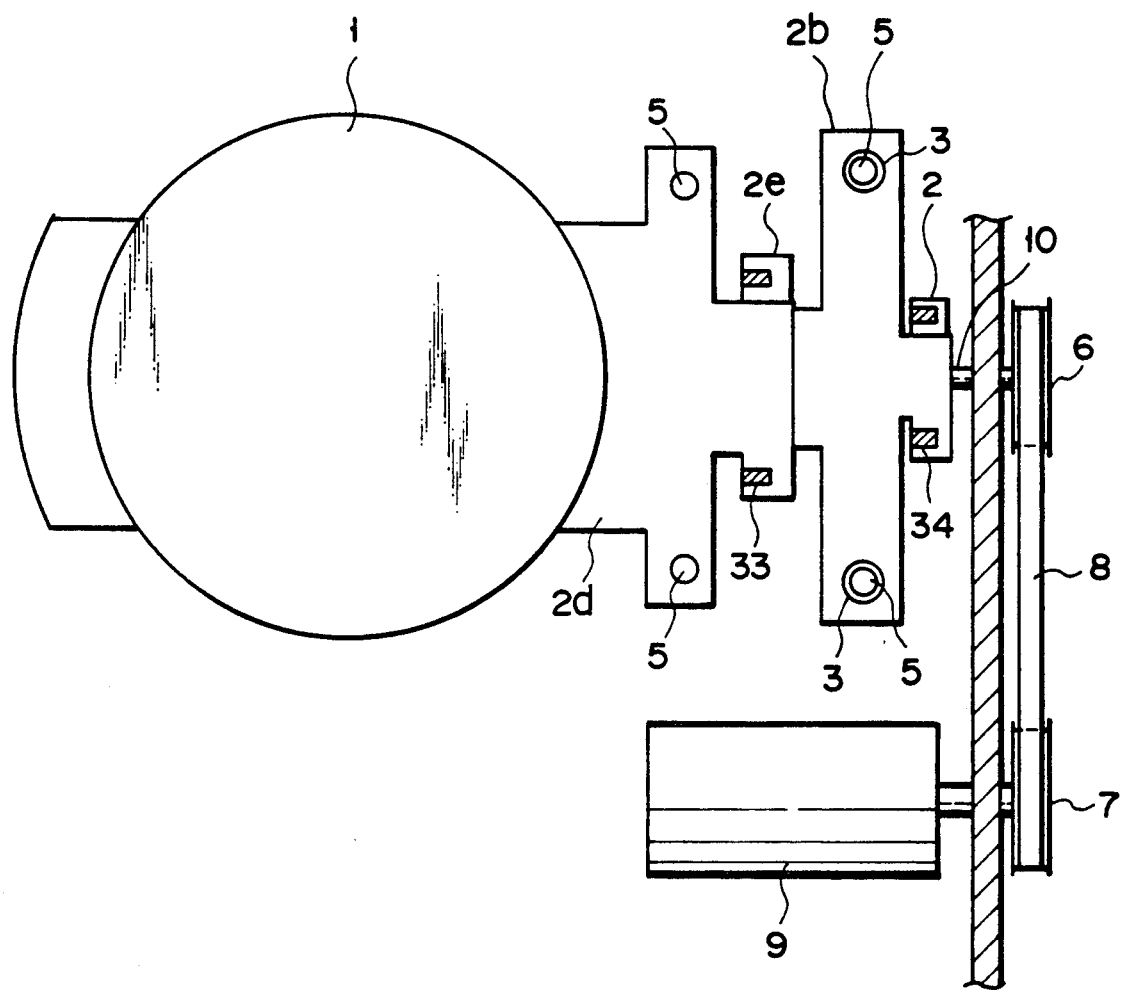
FIG. 9 is a top view of the apparatus in FIG. 8.

As shown in FIG. 8, the above-mentioned rotating shaft 10 is arranged at a lower portion of the frame 4. This rotating shaft 10 is connected to a motor 9 through pulleys 6 and 7 and a belt 8 consisting of an elastic material such as silicone rubber, as shown in FIG. 9. An outer arm pulley 31 and an intermediate arm pulley 32 are coaxially fixed to the rotating shaft 10 to be rotated upon rotation of the rotating shaft 10. The outer arm pulley 31 constitutes the second rotating member (second pulley), whereas the intermediate arm pulley 32 constitutes the first rotating member (first pulley). The diameter of the outer arm pulley 31 is set to be twice that of the intermediate arm pulley 32.

A driver shaft 30 is arranged at an upper portion of the frame 4 to oppose the rotating shaft 10. The driver shaft 30 is rotatably supported by the frame 4.

An intermediate arm driven pulley 32a and an outer arm driven pulley 31a respectively corresponding to the intermediate arm pulley 32 and the outer arm pulley 31 are fitted on the driven shaft 30. The intermediate arm driven pulley 32a has the same diameter as that of the intermediate arm pulley 32. The outer arm driven pulley 31a has the same diameter as that of the outer arm pulley 31.

An outer arm belt 33 as the second coupling element (second driving belt) is looped around the outer arm pulley 31 and the driven pulley 31a. An intermediate arm belt 34 as the first coupling element (first driving belt) is looped around the intermediate arm pulley 32 and the pulley 32a.

Intermediate arms 2b and 2c are respectively attached to one and the other sides of the intermediate arm belt 34. Upon rotation of the intermediate arm pulley 32, the intermediate arm belt 34 causes the intermediate arms 2b and 2c to come close to each other and separate from each other in the vertical direction.

Similarly, outer arms 2d and 2e are connected to one and the other sides of the outer arm belt 33. Upon rotation of the outer arm pulley 31, the outer arm belt 33 causes the outer arms 2d and 2e to come close to each other and separate from each other in the vertical direction.

Since the diameter of the outer arm pulley 31 is set to be twice that of the intermediate arm pulley 32, even if the rotating shaft 10 is rotated by the motor 9 to change the interval between the intermediate arms 2b and 2c and the interval between the outer arms 2d and 2e, the interval between the outer arms 2d and 2e is always twice the interval between the intermediate arms 2b and 2c. Therefore, the arms are kept at equal intervals.

Other arrangements and operations are the same as those of the first embodiment.

According to such a mechanism, the pitch of the semiconductor wafers 1 can be arbitrarily changed by slightly rotating the motor 9.

According to this embodiment, the outer arms 2d and 2e and the intermediate arms 2b and 2c are driven by using the outer arm pulley 31, the intermediate arm pulley 32, the outer arm belt 33, and the intermediate belt 34, thus changing the pitch of the semiconductor wafers 1. Therefore, in comparison with, e.g., a case wherein ball screws are used, the number of revolutions of the motor 9 required to change the wafer pitch can be reduced, and the amount of generated dust can be decreased.

In addition, the amount of generated metal dust or oil mist is small. If the diameter of each pulley is increased, a predetermined arm driving operation can be performed with a small amount of rotation of the pulley, thereby greatly reducing the amount of dust generated from the pulleys and the belts.

An apparatus according to the third embodiment of the present invention will be described below with reference to FIGS. 10 to 13. Note that the same reference numerals in the third embodiment denote the same parts as in the first and second embodiments, and only different portions will be described below.

In the apparatus of the third embodiment, the intervals between arms 2a to 2e are changed by using a pulley group 47 constituted by four pulleys, and expandable members 45.

Figure 10:
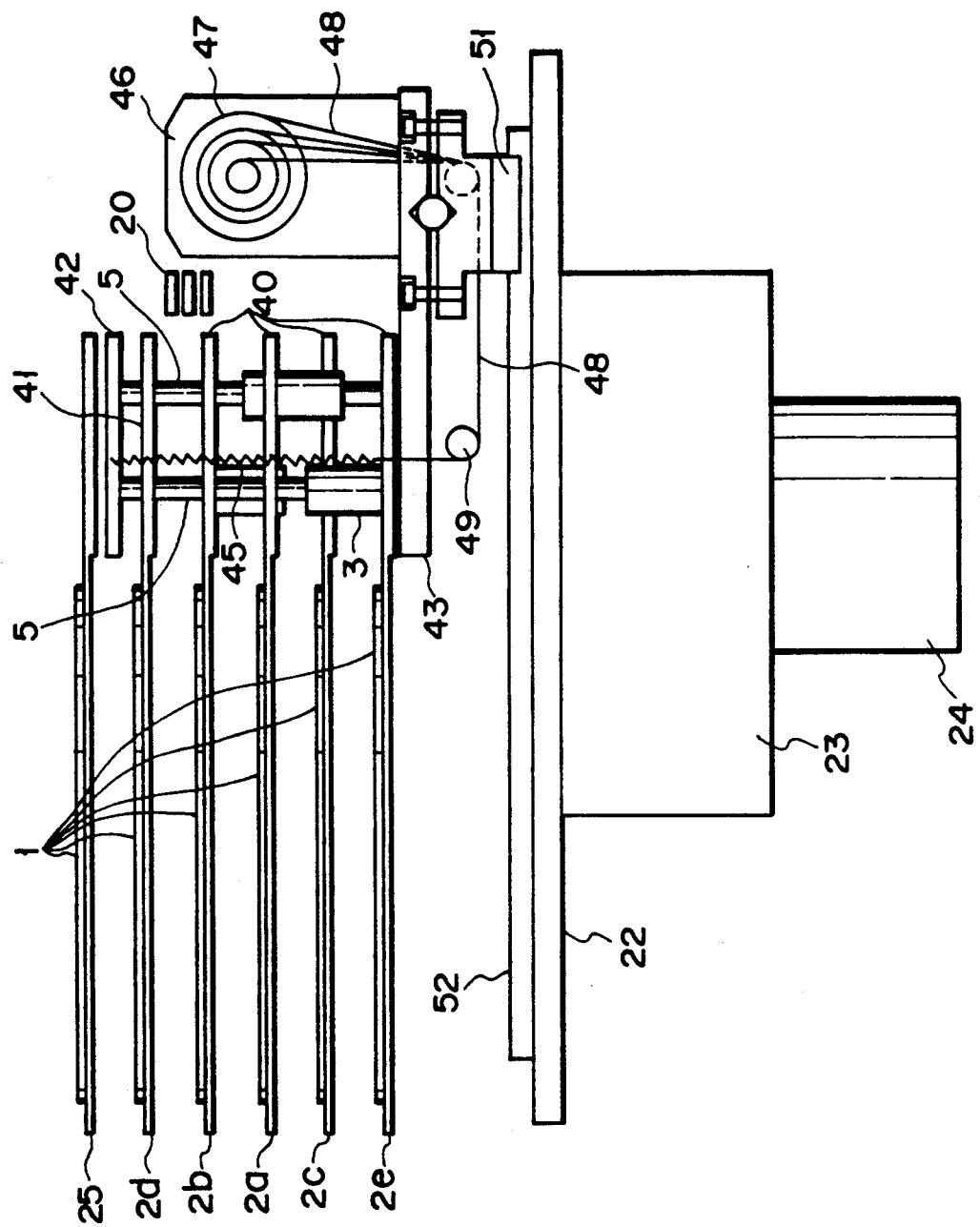
FIG. 10 is a side view schematically showing the internal mechanism of an apparatus according to the third embodiment of the present invention.

As shown in FIG. 10, the five arms 2a to 2e for holding and conveying semiconductor wafers 1 are vertically stacked at predetermined equal intervals.

Figure 11:
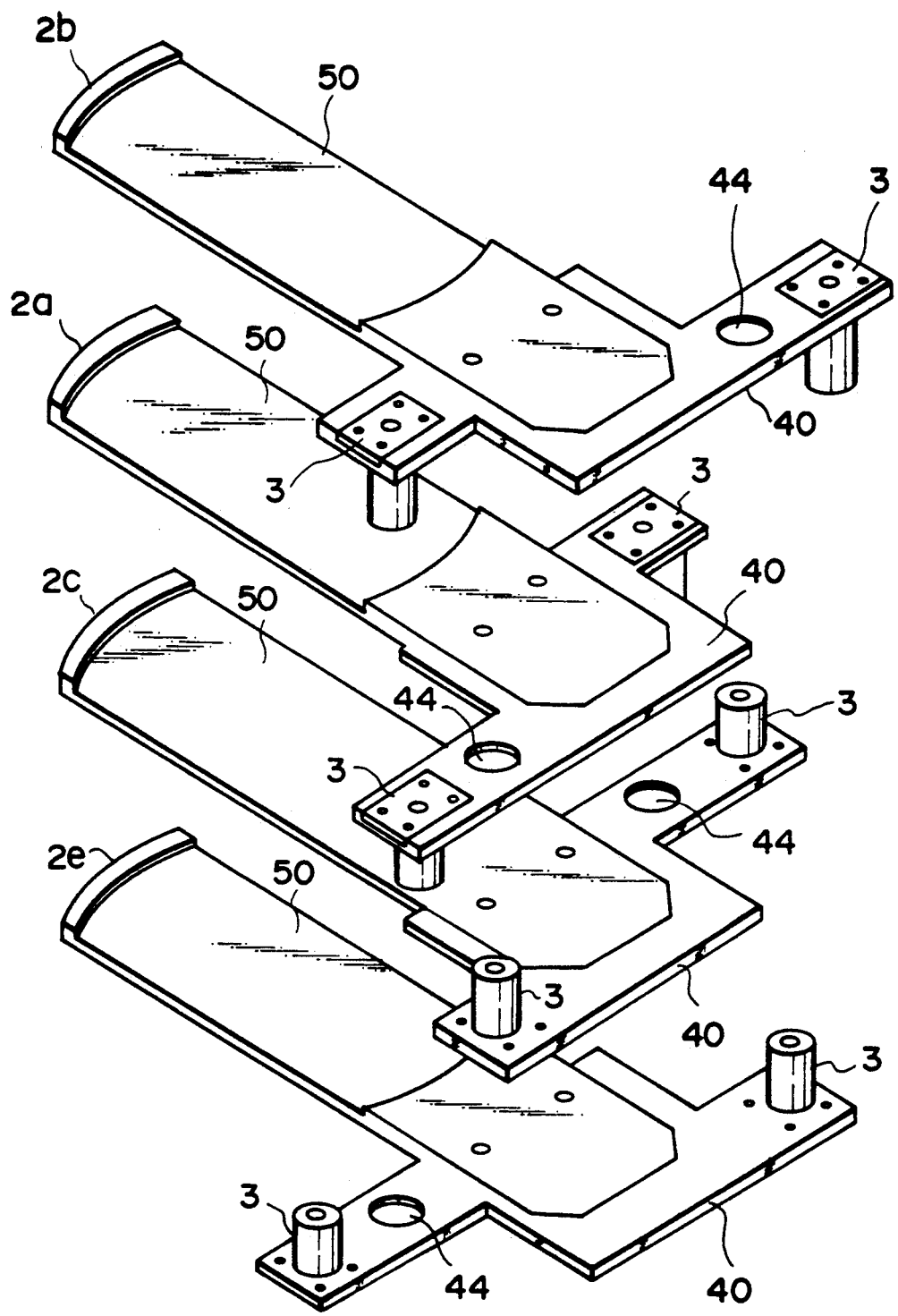
FIG. 11 is a perspective view showing arms in FIG. 10.

As shown in FIG. 11, moving plates 40 consisting of, e.g., thin aluminum plates are arranged on the proximal end sides of the arms except for the uppermost arm, i.e., the four arms 2a, 2b, 2c, and 2e. On each moving plate 40, linear sliders 3 are arranged at two positions. As shown in FIG. 10, round rods 5 are inserted through linear sliders 3 so that the arms 2 arranged on the moving plates 40 can be smoothly slid along the round rods 5.

Eight pairs of the linear sliders 3 and the round rods 5 are arranged to allow translation of the four moving plates 40.

A stationary plate 41 is arranged above the four moving plates 40 to be fixed to the round rods 5. The uppermost arm 2d is arranged on the stationary plate 41. The five arms 2a to 2e are arranged in this manner.

Upper and lower plates 42 and 43 are arranged to fix the round rods 5 for positioning the five arms 2a to 2e. The eight round rods 5 are respectively held at predetermined positions.

As shown in FIG. 11, the moving plates 40 respectively have holes 44 through which the linear sliders 3 arranged on the adjacent moving plates 40 are inserted. With this arrangement, the moving plates 40 can be brought into tight contact with each other.

Figure 12:
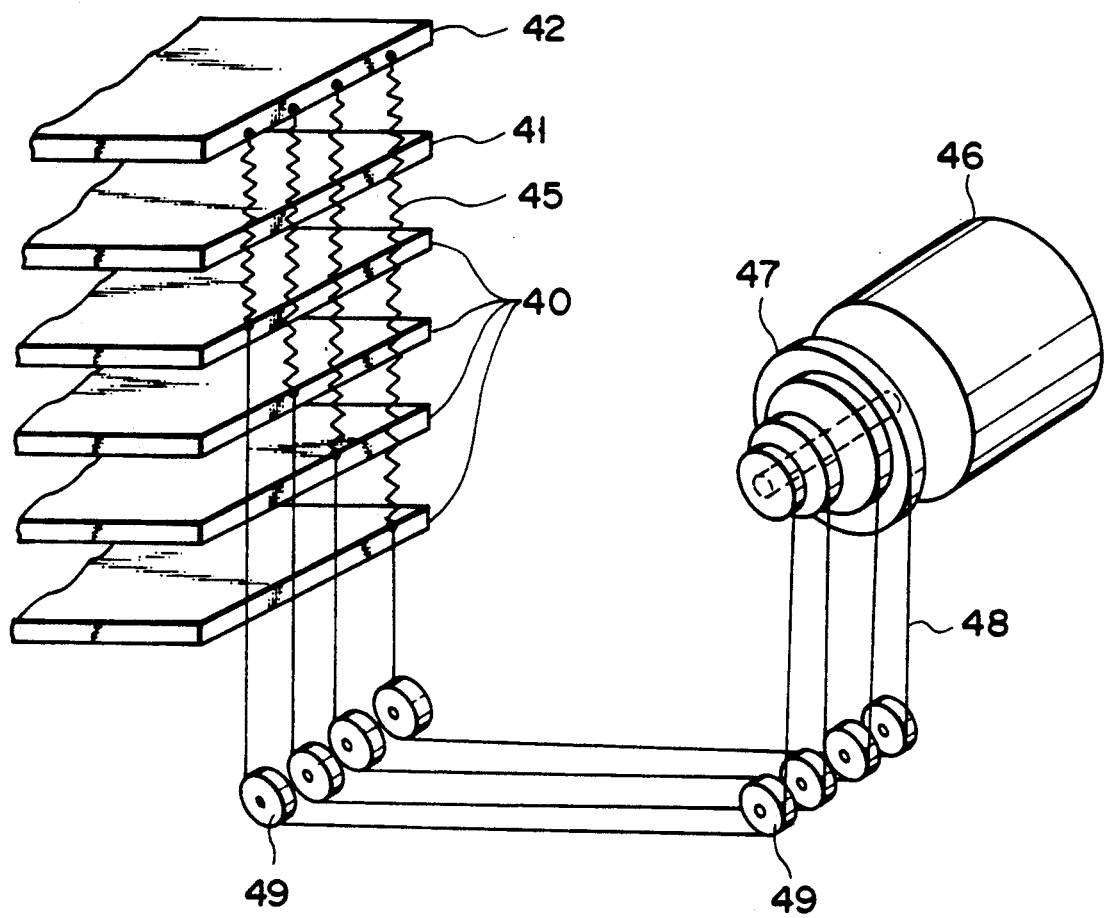
FIG. 12 is a perspective view showing expandable members and rotational movement transmission media.

As shown in FIG. 12, one end portion of each of the four expandable members 45, each consisting of a coil spring, is fixed to the proximal end of the upper plate 2. The other end portion of each of the expandable members 45 is fixed to a corresponding one of the four moving plates 40.

The pulley group 47, constituted by four pulleys diameter ratios of 1:2:3:4, is coaxially fixed to the rotating shaft of a motor 46 constituted by a stepping motor so as to be rotated upon rotation of the motor 46. One end portion of each of four rotational movement transmission media 48, each consisting of a stainless wire, is fixed to the outer surface of a corresponding one of the pulleys of the pulley group 47. The other end portion of each of the rotational movement transmission media 48 is fixed to a corresponding one of the four moving plates 40 through a corresponding intermediate pulley 49.

Recess portions 50 are respectively formed in the arms 2a, 2b, 2c, and 2e to receive the wafers 1 while the peripheral portions of the wafers 1 are respectively fitted in the recesses 50, as shown in FIG. 11. The wafers 1 are mounted in these recesses 50 to be conveyed.

Figure 13:
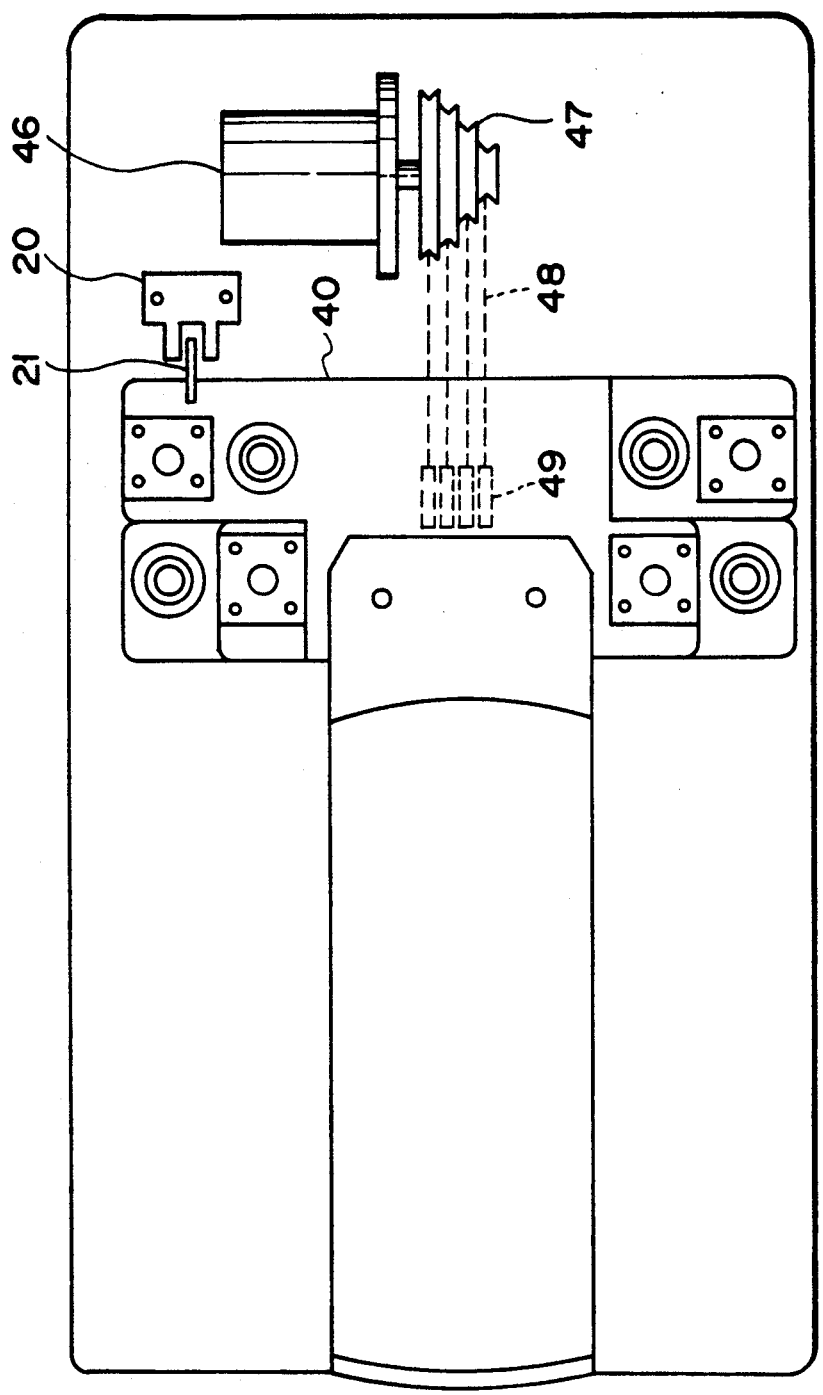
FIG. 13 is a top view of the apparatus in FIG. 10.

As shown in FIG. 13, in this embodiment, a light-shielding plate 21 is provided for only the uppermost moving plate 40, i.e., the moving plate 40 for the arm 2b. Three optical sensors 20 are arranged within the range in which the light-shielding plate 21 is moved upon movement of the moving plate 40.

As shown in FIG. 10, the internal mechanism of the plate-like member conveying apparatus having the above-described arrangement is designed such that the apparatus is held by a linear moving unit 51 constituted by, e.g., a linear slider, and is horizontally moved on a rail 52 by a motor (not shown).

Other arrangements and operations are the same as those in the first embodiment.

As described above, according to the third embodiment, the intervals between the arms 2 can be freely changed by using the pulley group 47, which is constituted by the four pulleys having four different diameters and fixed to the rotating shaft of the motor 46, the rotational movement transmission media 48, and the expandable members 45. Therefore, a simple, low-cost plate-like member conveying apparatus can be provided.

In addition, since a pitch changing mechanism using screw shafts and nuts is not used, only a small amount of dust is generated. This prevents a decrease in yield of semiconductor elements, which tends to occur when dust adheres to the conveyed wafer 1.

According to each of the three embodiments described above, since the single wafer transfer arm 25 for transferring a single wafer is arranged, a monitor semiconductor wafer 1 can be easily transferred.

An apparatus according to the fourth embodiment of the present invention will be described below with reference to FIGS. 14 and 15. Note that the same reference numerals in the fourth embodiment denote the same parts as in the first to third embodiments, and only different portions will be described below.

The apparatus of this embodiment is designed to change the intervals between arms 2a to 2e by using two translating mechanisms 64, each consisting of a link mechanism, and a screw shaft 56.

Figure 14:
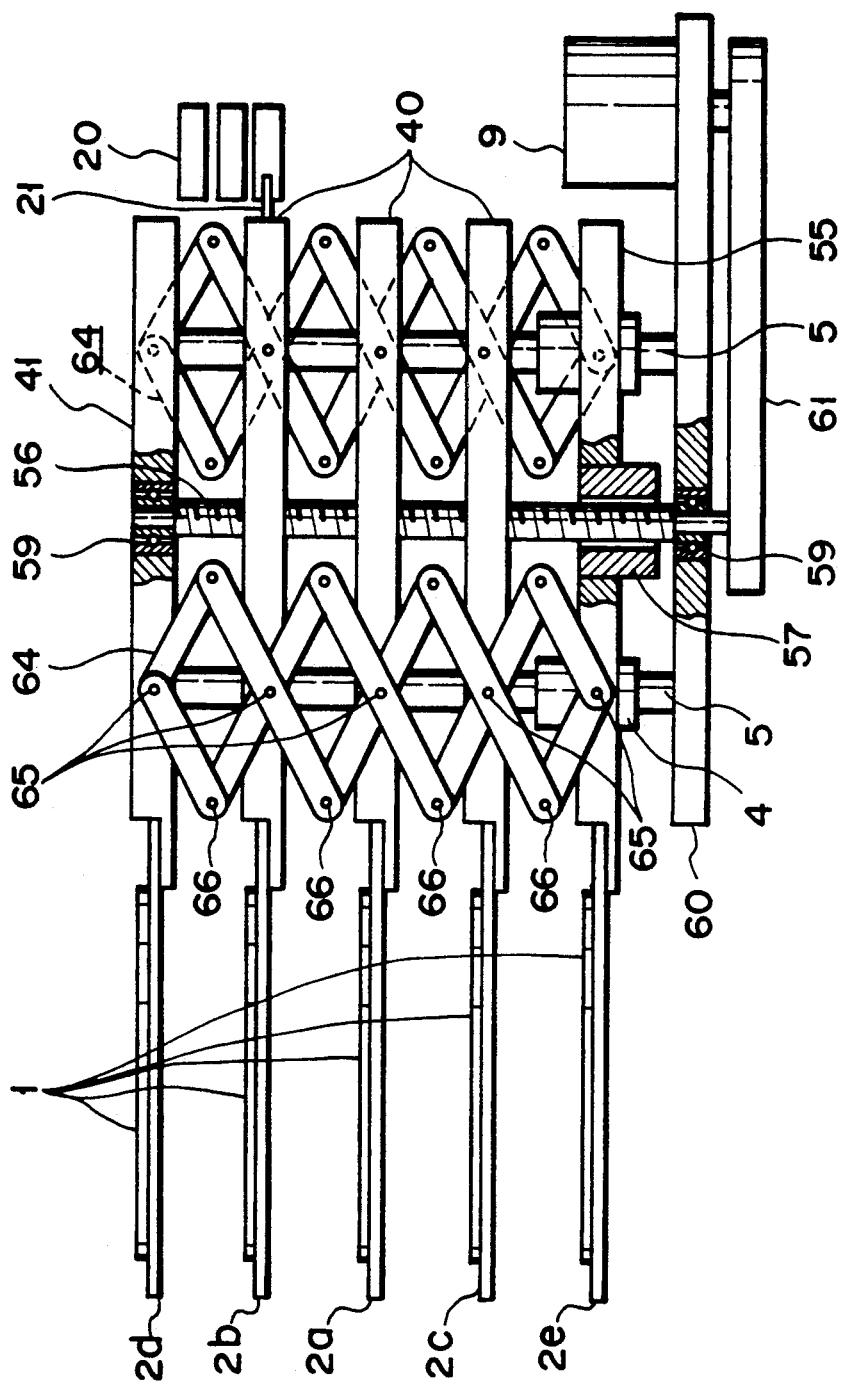
FIG. 14 is a side view schematically showing the internal mechanism of an apparatus according to the fourth embodiment of the present invention.
Figure 15:
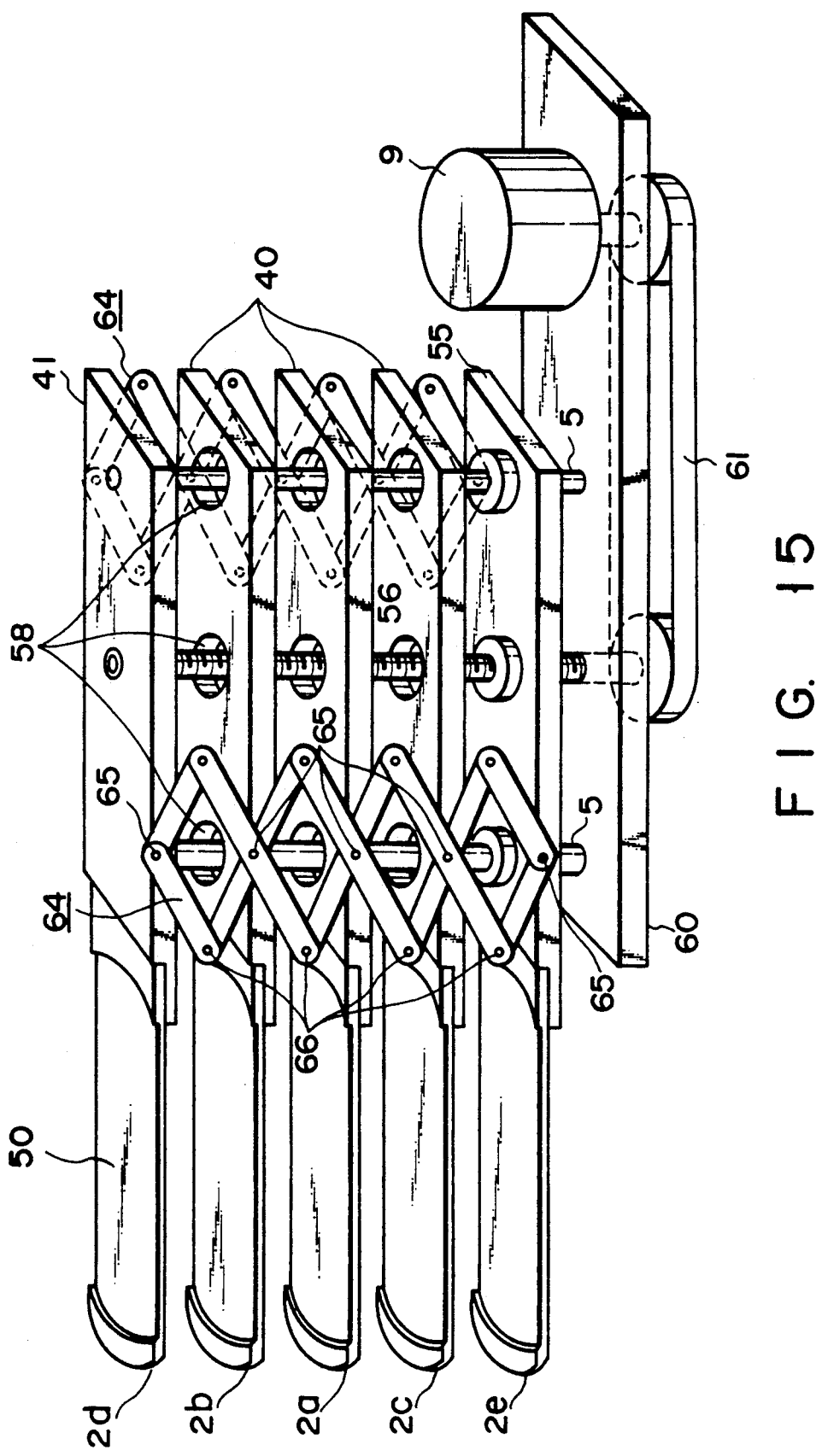
FIG. 15 is a perspective view of the apparatus in FIG. 14.

As shown in FIG. 14, a movable plate 55 is arranged at the proximal end of the lowermost arm 2e. A nut 57 to be engaged with the screw shaft 56 is arranged at a central portion of the movable plate 55. On the two sides of the nut 57, two linear sliders 4 are arranged to be fitted on a round rod 5. Moving plates 40 are respectively arranged at the proximal ends of the three arms 2a, 2b, and 2c arranged at intermediate positions. As shown in FIG. 15, three holes 58 are formed in each moving plate 40. The two round rods 5 and the screw shaft 56 are inserted through these holes 58. The upper end portions of the two round rods 5 are fixed to a stationary plate 41 arranged on one end of the uppermost arm 2d. A bearing 59 is arranged at a central portion of the stationary plate 41, and the upper end of the screw shaft 56 is received by the bearing 59.

A base 60 is arranged below the movable plate 55. The lower end portions of the two round rods 5 are fixed and supported on the base 60. A bearing 59 identical with the one formed in the stationary plate 41 is formed in the base 60. A lower portion of the screw shaft 56 is received by this bearing 59 in such a manner that the lower end portion of the screw shaft 56 extends downward from the base 60.

A motor 9 is arranged on the proximal end side of the base 60. The rotating shaft of this motor 9 extends downward from the base 60. A belt 61 is looped around the rotating shaft of the motor 9 and the lower end portion of the screw shaft 56.

Two translating mechanisms 64, each consisting of a link mechanism, are fixed on the two sides of each of the plates, i.e., the movable plate 55, the moving plates 40, and the stationary plate 41, with shafts (not shown) provided for crossing portions 65 of the mechanisms 64.

Ball bearings (not shown) are respectively provided for the above-mentioned crossing portions 65 and other crossing portions 66 of the translating mechanisms 64 so that the respective members of the mechanisms 64 can be smoothly rotated about the crossing portions 65 and 66.

As described above, in the fourth embodiment, by using a moving means constituted by the screw shaft 56, the nut 57, and the motor 9, the intervals of the arms supported by the two translating mechanisms 64 can be freely and continuously changed while the arms are kept at equal intervals. Therefore, a simple, low-cost plate-like member conveying apparatus can be provided. In addition, since only one pair of the screw shaft 56 and the nut 57 is used, only a small amount of dust is generated. This prevents a decrease in yield of semiconductor elements, which tends to occur when dust adheres to a conveyed wafer.

Note that if only one translating mechanism 64 is used as shown in FIG. 16, the arrangement of the apparatus can be further simplified.

The present invention is not limited to the four embodiments described above, but various other embodiments and modifications can be made. For example, an origin sensor portion for detecting the position of a predetermined one of the arms 2a to 2e may be arranged so that the positions of the respective arms can be detected with reference to the origin position, of the predetermined arm, detected by the origin sensor portion. In addition, as a means for changing the intervals between the arms, a mechanism having an eccentric cam rotated by a motor may be used.

Furthermore, the plate-like member conveying apparatus may be designed such that two overrun sensor portions (not shown), each of which has the same arrangement as that described above, and which serve to detect upper and lower limit positions are arranged to detect that the arms 2a to 2e are moved outside of predetermined movement ranges, and abnormality processing is performed when the sensor portions detect that the arms 2a to 2e overrun.

In each embodiment described above, the five arms are arranged. However, the apparatus may be designed to change the intervals between any number of arms exceeding one, e.g., 25 arms.

Each arm for holding a wafer my be designed to hold a portion of the lower surface of a wafer by vacuum chucking. If such vacuum chuck arms are used, the present invention can be applied to a case wherein wafers are vertically stored. A plate-like member is not limited to a semiconductor wafer. For example, the present invention can be applied to liquid crystal glass substrates and members having various shapes such as quadrangular and rectangular members.

The above-described plate-like conveying apparatuses can be used in the respective processes of semiconductor manufacturing apparatuses and liquid crystal manufacturing apparatuses and can be applied to CVD apparatuses, heat-treatment apparatuses for oxidation/diffusion, plasma processing apparatuses, carrier stocker apparatuses, boat stocker apparatuses, and the like.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A plate-like member conveying apparatus for conveying a plurality of plate-like members while supporting the members to be vertically stacked at equal intervals and be substantially parallel to each other, comprising:
   a first support arm for supporting a plate-like member;
   second and third support arms, respectively arranged above and below said first support arm, for respectively supporting plate-like members;
   a rotatable driving shaft;
   a first rotating member coaxially fixed to said driving shaft to be rotated upon rotation of said driving shaft and having an outer peripheral surface;
   a first coupling element for coupling the outer surface of said first rotating member to said second and third support arms, and for causing said second and third arms to vertically come close to each other and separate from each other in accordance with rotation of said first rotating member;
   fourth and fifth support arms, respectively arranged above and below said second and third support arms, for supporting plate-like members, said fourth and fifth support arms being vertically separated from each other by a distance twice a distance between said second and third support arms;
   a second rotating member coaxially fixed to said driving shaft to be rotated upon rotation of said driving shaft and having a outer peripheral surface; and
   a second coupling element for coupling the outer surface of said second rotating member to said fourth and fifth support arms, and for causing said fourth and fifth support arms to vertically come close to each other and separate from each other in accordance with rotation of said second rotating member,
   the outer peripheral surfaces of said first and second rotating members set to be different from each other to change intervals between said first to fifth support arms, while keeping said first to fifth support arms at equal intervals, and causing said fourth and fifth support arms to separate from each other by a distance twice a distance between said second and third support arms.

2. A plate-like member conveying apparatus for conveying a plurality of plate-like members while supporting the members to be vertically stacked at equal intervals and be substantially parallel to each other, comprising:
   a first support arm for supporting a plate-like member;
   second and third support arms, respectively arranged above and below said first support arm, for respectively supporting plate-like members;
   a rotatable driving shaft;
   a first pinion coaxially fixed to said driving shaft to be rotated upon rotation of said driving shaft and having teeth on an outer surface thereof;
   a first rack for coupling said first pinion to said second and third support arms, and for causing said second and third arms to vertically come close to each other and separate from each other in accordance with rotation of said first pinion;
   fourth and fifth support arms, respectively arranged above and below said second and third support arms, for supporting plate-like members, said fourth and fifth support arms being vertically separated from each other by a distance twice a distance between said second and third support arms;
   a second pinion coaxially fixed to said driving shaft to be rotated upon rotation of said driving shaft and having teeth on an outer surface thereof; and
   a second rack for coupling said second pinion to said fourth and fifth support arms, and for causing said fourth and fifth support arms to vertically come close to each other and separate from each other in accordance with rotation of said second pinion,
   the numbers of said teeth of said first and second pinions being different from each other to change intervals between said first to fifth support arms, while keeping said first to fifth support arms at equal intervals, and causing said fourth and fifth support arms to separate from each other by a distance twice a distance between said second and third support arms.

3. An apparatus according to claim 2, further comprising a frame, said first arm being fixed to said frame.

4. An apparatus according to claim 3, wherein said driving shaft is supported on said frame to be rotated about a horizontal axis.

5. An apparatus according to claim 4, wherein said first and second racks vertically extend.

6. An apparatus according to claim 5, wherein said second pinion is located closer to said first to fifth arms than said first pinion is.

7. An apparatus according to claim 6, wherein said first and second pinions and said first and second racks essentially consist of a hard resin.

8. A plate-like member conveying apparatus for conveying a plurality of plate-like members while supporting the members to be vertically stacked at equal intervals and be substantially parallel to each other, comprising:
   a first support arm for supporting a plate-like member;
   second and third support arms, respectively arranged above and below said first support arm for respectively supporting plate-like members;
   a rotatable driving shaft;
   a first pulley having a diameter and coaxially fixed to said driving shaft to be rotated upon rotation of said driving shaft;
   a first driving belt for coupling said first pulley to said second and third support arms, and for causing said second and third arms to vertically come close to each other and separate from each other in accordance with rotation of said first pulley;
   fourth and fifth support arms, respectively arranged above and below said second and third support arms, for supporting plate-like members, said fourth and fifth support arms being vertically separated from each other by a distance twice a distance between said second and third support arms;

a second pulley having a diameter and coaxially fixed to said driving shaft to be rotated upon rotation of said driving shaft; and a second driving belt for coupling said second pulley to said fourth and fifth support arms, and for causing said fourth and fifth support arms to vertically come close to each other and separate from each other in accordance with rotation of said second pulley, the diameters of said first and second pulleys being different from each other to change intervals between said first to fifth support arms, while keeping said first to fifth support arms at equal intervals, and causing said fourth and fifth support arms to separate from each other by a distance twice a distance between said second and third support arms.

9. An apparatus according to claim 8, further comprising a frame, said first arm being fixed to said frame.

10. An apparatus according to claim 9, wherein said driving shaft is supported on said frame to be rotated about a horizontal axis.

11. An apparatus according to claim 10, further comprising a driven shaft which is supported on said frame to be rotated about a horizontal axis and is rotated upon rotation of said driving shaft.

12. An apparatus according to claim 11, wherein said driven shaft comprises first and second driven pulleys respectively having the same diameters as those of said first and second pulleys, said first driving belt is looped around said first pulley and said first driven pulley, and said second driving belt is looped around said second pulley and said second driven pulley.

13. An apparatus according to claim 12, wherein said second pulley is located closer to said first to fifth arms than said first pulley is.

* * * * *